(12) United States Patent
Watanabe (10) Patent No.: US 8,978,237 B2
(45) Date of Patent: Mar. 17, 2015

(54) METHOD TO ASSEMBLE OPTICAL DEVICES WITH OPTICALLY INTERFERING DEVICE

(75) Inventor: Tohru Watanabe, Yokohama (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 99 days.

(21) Appl. No.: 13/599,825

(22) Filed: Aug. 30, 2012

(65) Prior Publication Data

US 2013/0055545 A1 Mar. 7, 2013

(30) Foreign Application Priority Data

Aug. 31, 2011 (JP) ................. P2011-189921

(51) Int. Cl.
| | | |
|---|---|---|
| *H04R 31/00* | (2006.01) |
| *G02B 6/12* | (2006.01) |
| *H01S 5/026* | (2006.01) |
| *H01S 5/0625* | (2006.01) |
| *G02B 6/42* | (2006.01) |
| *G02F 1/21* | (2006.01) |
| *H01S 5/022* | (2006.01) |
| *H01S 5/024* | (2006.01) |
| *H01S 5/12* | (2006.01) |

(52) U.S. Cl.
CPC .......... *G02B 6/12007* (2013.01); *H01S 5/0261* (2013.01); *H01S 5/06258* (2013.01); *G02B 6/4233* (2013.01); *G02F 2001/212* (2013.01); *H01S 5/02208* (2013.01); *H01S 5/02284* (2013.01); *H01S 5/02415* (2013.01); *H01S 5/1209* (2013.01); *H01S 5/1212* (2013.01)

USPC ................ 29/594; 29/428; 29/464; 29/609.1; 29/833; 359/239; 359/248; 359/249; 385/2; 385/5; 385/14

(58) Field of Classification Search
USPC ............. 29/428, 464, 592.1, 594, 609.1, 833; 385/2, 5, 14; 359/239, 248, 249
See application file for complete search history.

(56) References Cited

U.S. PATENT DOCUMENTS

| | | | | |
|---|---|---|---|---|
| 5,071,248 A * | 12/1991 | Tiefenthaler et al. | .......... | 356/128 |
| 5,120,131 A * | 6/1992 | Lukosz | .......... | 356/481 |
| 5,442,169 A * | 8/1995 | Kunz | ....... | 250/227.21 |
| 5,623,561 A * | 4/1997 | Hartman | .......... | 385/12 |
| 5,754,714 A * | 5/1998 | Suzuki et al. | .......... | 385/5 |
| 7,421,200 B2* | 9/2008 | Liu et al. | .......... | 398/45 |
| 7,433,045 B2* | 10/2008 | Ronnekleiv et al. | .......... | 356/478 |
| 7,826,122 B2* | 11/2010 | Morishita | ........ | 359/239 |
| 2006/0045809 A1* | 3/2006 | Shirai et al. | ....... | 422/82.11 |
| 2007/0171514 A1* | 7/2007 | Rong et al. | .......... | 359/326 |
| 2011/0142082 A1* | 6/2011 | Jeon et al. | .......... | 372/6 |

FOREIGN PATENT DOCUMENTS

JP 2004-078002 3/2004

* cited by examiner

*Primary Examiner* — Paul D Kim
(74) *Attorney, Agent, or Firm* — Venable LLP; Michael A. Sartori; Tamatane J. Aga (57) ABSTRACT

A method to align an optical device optically with an interference device is disclosed. The method includes steps of: selecting one of arm waveguides, biasing rest of arm waveguides to cause optical absorption thereat, and aligning the optical device optically with the selected arm waveguide.

11 Claims, 6 Drawing Sheets

METHOD TO ASSEMBLE OPTICAL DEVICES WITH OPTICALLY INTERFERING DEVICE

BACKGROUND OF THE INVENTION

1. Field of the Invention

The present invention relates to a method to assemble optical device optically with an interfering device.

2. Related Background Arts

An optical device combining a semiconductor laser diode (hereafter denoted as LD) with an optically interfering device has been known. When another optical device couples optically with the interfering device, in particular, the other optical devices is optically aligned with the interfering device, light output from the LD and processed in the interfering device is practically used.

The interfering device in the optical output power thereof depends on not only optical coupling losses but an interference status between phases of two optical beams propagating therein. Accordingly, even when other optical devices are assembled with the interfering device such that the optical output power thereof is set within a preset range, the optical output power in practical usage of the device sometimes deviates from the standard.

SUMMARY OF THE INVENTION

One aspect of the present application relates to a method to assemble an optical module implemented with an interfering device with an optical fiber such that an optical power of light output from the interfering device and entering the optical fiber is set within a preset range. The method comprises steps of: (1) selecting one of arm waveguides formed in the interfering device, the selected one arm waveguide coupling with the optical fiber; (2) biasing rest of arm waveguides not selected in a previous step, the biased arm waveguides causing optical absorption thereat; and (3) aligning the optical fiber with the selected arm waveguide. The arm waveguides not selected in the first step substantially fully absorbs light propagating therein so as not to cause the interference with light propagating in the selected arm waveguides. Accordingly, the light output from the interfering device causes no power fluctuation depending on the phase difference between light each propagating within selected and unselected arm waveguides.

The interfering device may be an optical modulator of the Mach-Zender type which has an input coupler, an output coupler, and two arm waveguides coupling the input coupler with the output coupler. The input and output couplers may be a type of 2×2 multimode interference (MMI) coupler. Moreover, the Mach-Zender modulator of the embodiment may be formed on a semiconductor substrate, typically, made of InP. The Mach-Zender modulator of the embodiment may receive light in the input coupler thereof emitted from an LD, preferably, a wavelength tunable LD whose emission wavelength is variable. The absorbance of the unselected arm waveguide is preferable greater than 20 dB by receiving the reverse bias.

BRIEF DESCRIPTION OF THE DRAWINGS

The foregoing and other purposes, aspects and advantages will be better understood from the following detailed description of a preferred embodiment of the invention with reference to the drawings, in which.

DESCRIPTION OF PREFERRED EMBODIMENTS

Next, some preferred embodiments according to the present invention will be described as referring to drawings. In the description of the drawings, the numerals or symbols same or similar to each other will refer to the elements same or similar to each other without overlapping explanations.

Figure 1A:
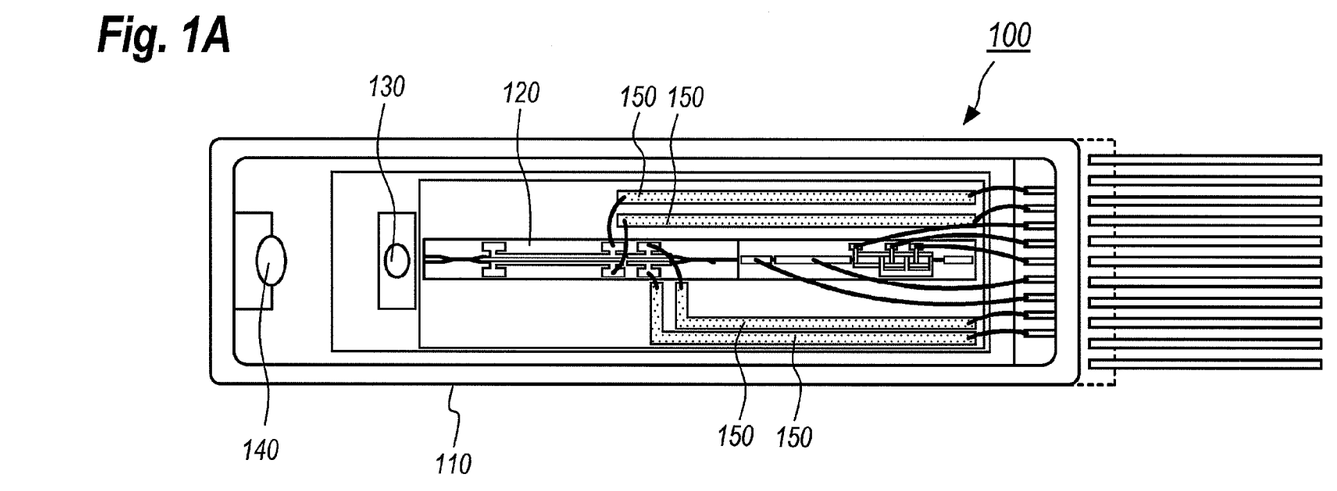
FIG. 1A is a plan view of an optical module according to an embodiment of the invention, and FIG. 1B schematically shows the optical module assembled with a coupling unit and an optical fiber.
Figure 1B:
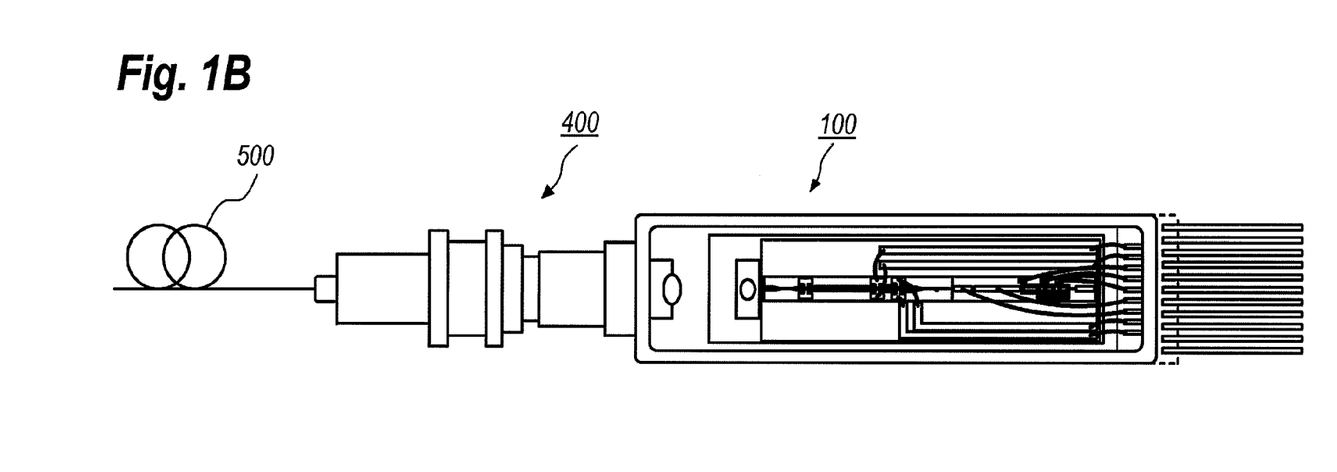

FIG. 1A is a plan view showing an optical module 100 to be assembled with an optical fiber by a method according to one embodiment of the invention, and FIG. 1B is also a plan view of the optical module 100 assembled with the optical finer 500 via a coupling unit 400. The optical module 100 according to the embodiment, as shown in FIG. 1A, includes a package 110, an optically active device 120, some optically passive devices, namely, the first lens 130 and the second lens 140, and a plurality of electrical interconnections 150.

The optically active device 120 integrates an LD with an interfering device. The present embodiment provides a wavelength tunable LD as the LD, while, the interfering device is a type of the Mach-Zender device.

Figure 4A:
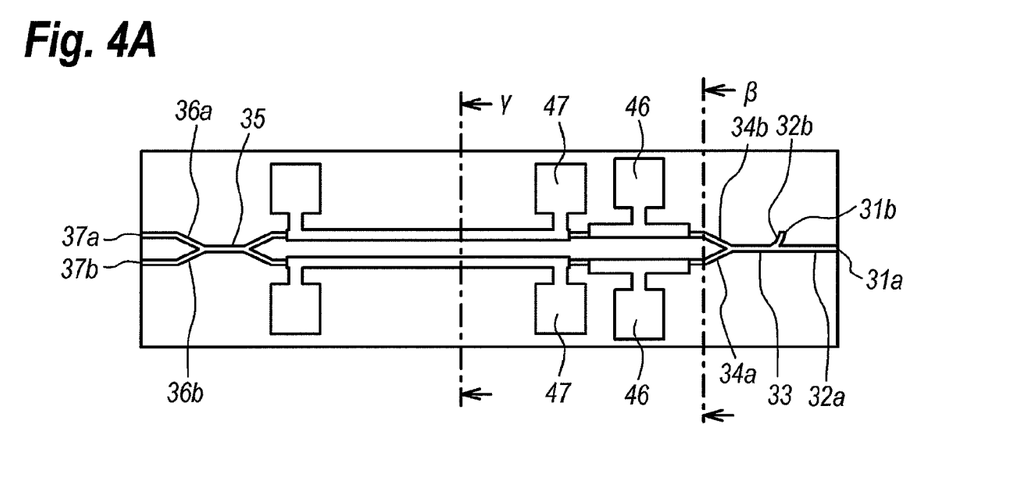
FIG. 4A is a plan view of an interfering device.

The first lens 130 optically couples one of the first output port 37a and the second output port 37b of the interfering device 120, which are shown in FIG. 4, with the optical fiber 500 via the second lens 140 and the coupling unit 400. The first lens 130 is installed within the package 110 after it is mounted on a sub-mount on which the optically active device 120 is also mounted.

The second lens 140 is rigidly assembled with one of sides of the package 110. The interconnections 150 are bonded with electrodes of the optically active device 120 with respective bonding wires to provide electrical signals and electrical power to operate the optically active device 120. Thus, the light output from the LD is modulated by the interfering device, and only one of the output ports, 37a and 37b, emits the light to be provided externally via the first and second lenses, 130 and 140.

Figure 2A:
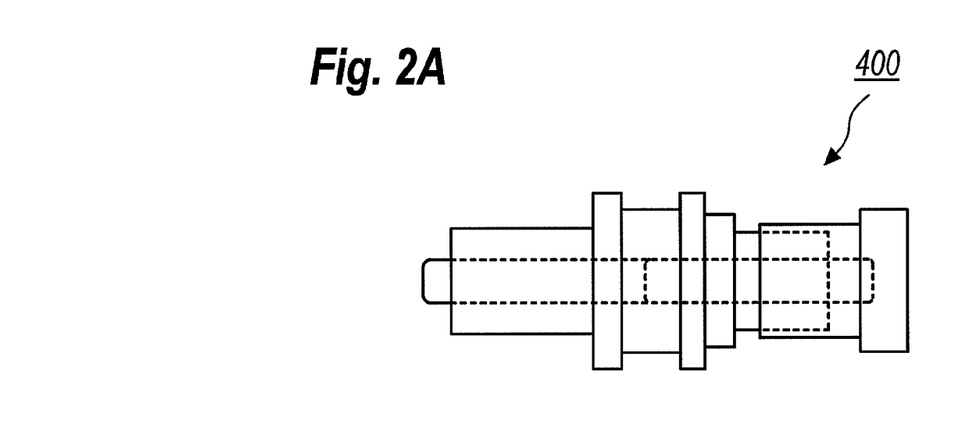
FIG. 2A schematically shows the coupling unit.
Figure 2B:
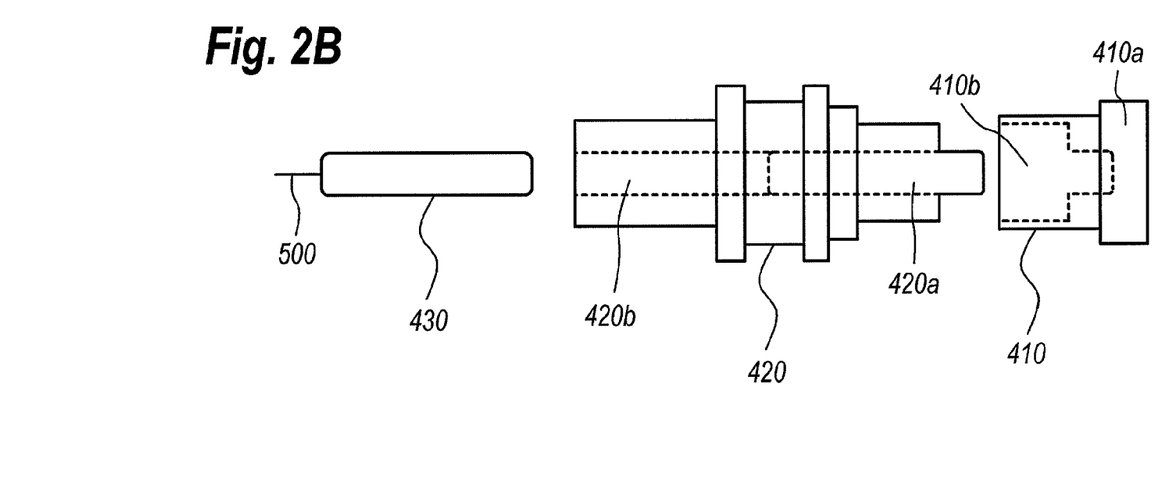
FIG. 2B is an exploded view of the coupling unit.

As shown in FIG. 1B, the optical module 100 couples with the optical fiber 500 via the coupling unit 400. FIG. 2A illustrates details of the coupling unit 400, while, FIG. 2B is an exploded view of the coupling unit 400.

The coupling unit 400 includes a joint sleeve 410, a receptacle 420 with a ferrule 420a, and an optical fiber 500 whose end provides another ferrule 430. The joint sleeve 410 and the receptacle 420 have a cylindrical shape with a center axis coincident with an optical axis of the optical fiber 500. The joint sleeve 410 provides a flange 410a in a root portion thereof, where the flange 410a is fixed to the side of the package 110. Inserting the receptacle 420 in the ferrule 420a thereof into a bore 410b of the joint sleeve 410, and adjusting an inserting depth thereof, the optical alignment along the optical axis is carried out, which is often called as the Z-alignment.

In the present optical module, the Z-alignment is performed by activating the LD 200 practically to guide the light emitted therefrom into the optical fiber 500 and adjust the insertion depth of the receptacle 420 into the joint sleeve 410 such that the optical power of the light output from another end of the optical fiber 500 becomes a preset condition. Thus, the coupling unit 400 is optically aligned with the optical module 100. In the Z-alignment, the optical power output from the optically active device 120 is necessary to be a preset value independent of optical status of the device 120. However, as described below, some optical devices, in particular, the interfering device 300 like the present embodiment varies the magnitude of the optical output even when externally set conditions are invariant for devices.

Figure 3A:
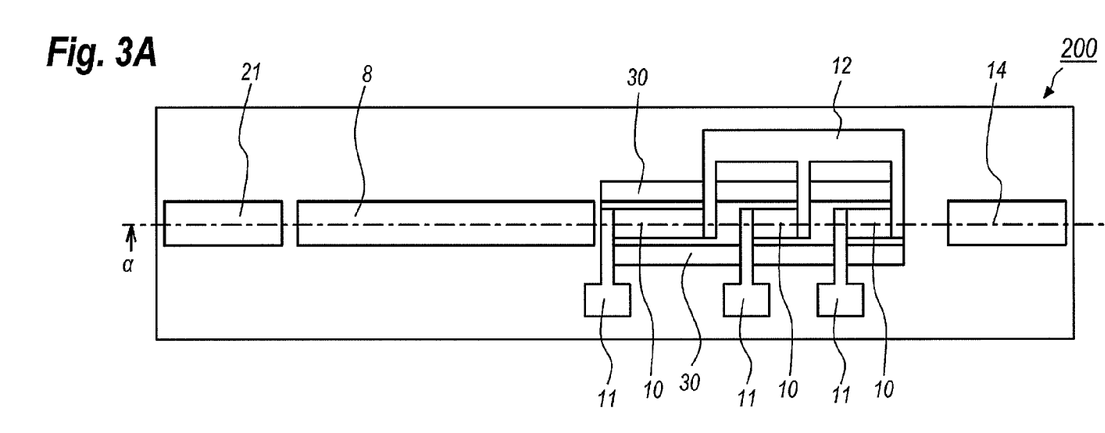
FIG. 3A is a plan view of a tunable LD.
Figure 3B:
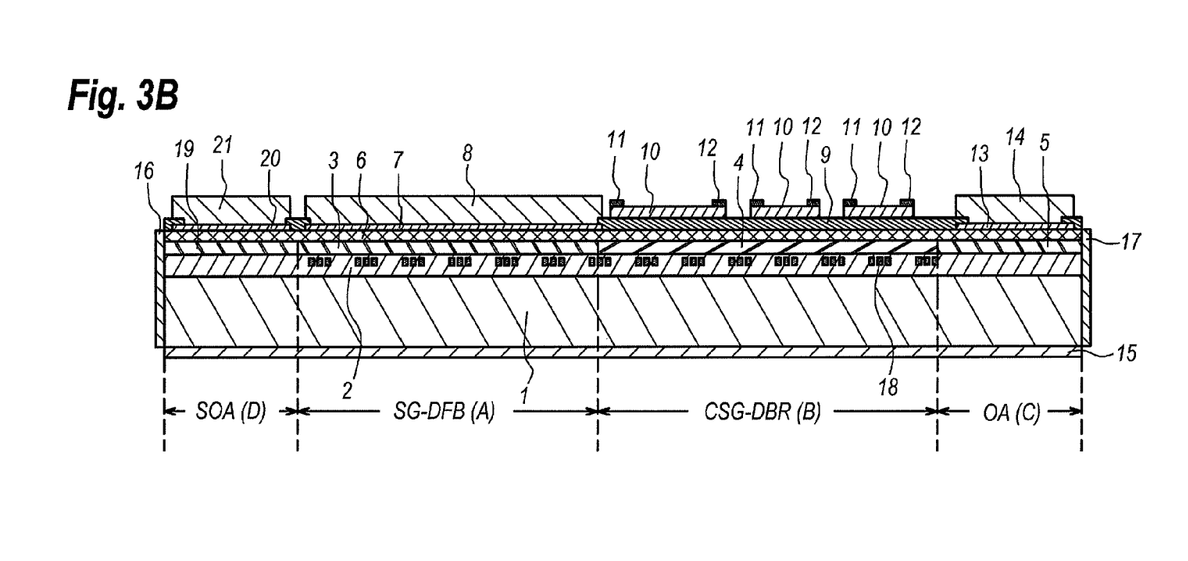
FIG. 3B shows a cross section of the LD taken along the line α-α appeared in FIG. 3A.

Next, the optically active device 120 will be described in detail. FIG. 3A is a plan view of the LD 200, while, FIG. 3B shows a cross section taken along the line α-α, namely, the optical axis thereof. The LD 200 includes an SOA (Semiconductor Optical Amplifier) region D, an SG-DFB (Sampled Grating Distributed Feedback) region A, a CSG-DBR (Chirped Sampled Grating Distributed Reflector) region B, and an OA (optical absorption) region C, where each of regions are serially arranged in this order along the optical axis.

The SG-DFB region A stacks, on the semiconductor substrate 1, a lower cladding layer 2, an active layer 3, an upper cladding layer 6, a contact layer 7, and an electrode 8. The CSG-DBR region B also stacks, on the semiconductor substrate 1, the lower cladding layer 2, a waveguide layer 4, the upper cladding layer 6, an insulating film 9, and a plurality of micro heaters 10. Each of micro heaters 10 accompanies with a supply electrode 11 for supplying electrical power thereto and a ground electrode 12. The OA region C also stacks on the semiconductor substrate 1 the lower cladding layer 2, an absorption layer 5, the upper cladding layer 6, a contact layer 13 and an electrode 14. The SOA region D stacks on the semiconductor substrate 1 the lower cladding layer 2, an amplifying layer 19, the upper cladding layer 6, a contact layer 20, and an electrode 21. In the present embodiment, the lower cladding layer 2 is made of n-type semiconductor material, while, the upper cladding layer 6 and contact layers, 7, 13, and 20 are made of p-type semiconductor materials; but the LD 200 may provide the reverse polarity, that is, the p-type lower cladding layer and the n-type upper cladding layer and the contact layer. Further, the insulating film 9 is also put between the electrode 8 and 21 to operate the SG-DFB region A and the SOA region D independently.

In the LD 200 thus configured, each of regions, A to D, provide the common substrate 1, the lower cladding layer 2 and the upper cladding layer 6; that is, those layers of the semiconductor substrate 1, the lower cladding layer 2, and the upper cladding layer 6 are electrically un-isolated. Moreover, the top level of the lower cladding layer 2 is even in those regions, A to D; that is, the active layer 3 in the SG-DFB region A, the waveguide layer 4 in the CSG-DBR region B, the optical absorption layer 5 in the OA region C, and the amplifying layer 19 in the SOA region D are formed on a substantially flat surface of the lower cladding layer 2.

The SG-DFB region A and the CSG-DBR region B provide within the lower cladding layer 2 a plurality of grating regions 18 each including corrugations. Each of the grating regions 18 includes semiconductor materials whose refractive index is different from that of the lower cladding layer 2. For instance, the grating region may be made of $Ga_{0.22}In_{0.78}As_{0.47}P_{0.53}$ when the lower cladding layer 2 is made of InP. One grating region 18 and a region neighbor to this one grating region 18 constitute a segment.

The CSG-DBR region B includes at least two types of segments each having a specific optical length different from others to show reflectance characteristics different from others; while, the segments in the SG-DFB region A have a length substantially equal to each other. Then, the SG-DFB region A has an optical gain spectrum with a plurality of gain peaks, while, the CSG-DBR region B shows a reflectance spectrum with a plurality of reflectance peaks. The LD 200 may emit light with an emission wavelength at which one of the gain peaks in the SG-DFB region A and one of the reflectance peaks in the CSG-DBR region B coincide.

In the present embodiment of the LD 200, the semiconductor substrate 1 is made of n-type InP, the lower cladding layer 2 is made of n-type InP, and the upper cladding layer 6 is made of p-type InP. The lower and upper cladding layers, 2 and 6, confine light within the active layer 3, the optical waveguide layer 4, the absorption layer 5, and the amplifying layer 19.

The active layer 3 is made of material showing an optical gain, for instance, the active layer 3 has a multi-quantum well (MQW) structure comprising alternately arranged well layers of $Ga_{0.32}In_{0.68}As_{0.92}P_{0.08}$ each having a thickness of 5 nm and barrier layers of $Ga_{0.22}In_{0.7}As_{0.47}P_{0.53}$ each having a thickness of 10 nm. The waveguide layer 4 is made of bulk material of, for instance, $Ga_{0.22}In_{0.78}As_{0.47}P_{0.53}$.

The absorption layer 5 includes a material having the absorption coefficient at the emission wavelength of the LD 200. Specifically, the material for the absorption layer 5 has the bandgap wavelength longer than the emission wavelength of the LD 200, preferably, longer than the longest emission wavelength of the LD 200. The absorption layer 5 in the present embodiment has the MQW structure including alternately arranged well layers of $Ga_{0.47}In_{0.53}As$ each having a thickness of 5 nm and barrier layers of $Ga_{0.28}In_{0.72}As_{0.61}P_{0.39}$ each having a thickness of 10 nm. In a modification, the absorption layer 5 may be a bulk material of $Ga_{0.46}In_{0.54}As_{0.98}P_{0.02}$. In another modification, the absorption layer 5 may have a structure same with that of the active layer 3. In this case, the absorption layer 5 may be concurrently formed with the active layer 3.

The amplifying layer 19 shows an optical gain by the current injection through the electrode 21. The amplifying layer 19 in the present embodiment also has the MQW structure including alternately arranged well layers of $Ga_{0.35}In_{0.65}As_{0.99}P_{0.01}$ each having a thickness of 5 nm and barrier layers of $Ga_{0.15}In_{0.85}As_{0.32}P_{0.68}$ each having a thickness of 10 nm. The amplifying layer 19 may also have the bulk structure of $Ga_{0.44}In_{0.56}As_{0.95}P_{0.05}$. In a modification, the amplifying layer 19 has the same arrangement with the active layer 3. In this case, the amplifying layer may be concurrently formed with the active layer 3.

The contact layers, 7, 13, and 20, are p-type $Ga_{0.47}In_{0.53}As$ in the embodiment. The insulating film 9 is made of inorganic material, for instance, SiN, $SiO_2$ and so on. The micro heaters 10 are formed by a metal thin film made of, for instance, NiCr. The present LD 200 shown in FIG. 2B provides a micro heater 10 extending in a plurality of segments, that is, the micro heater 10 is provided in a region including a several grating regions 18 and a space between the grating regions 18.

Electrodes, 8, 14, and 21 for respective regions, A, C and D, and those 11 and 12 for the micro heaters 10 are made of metal stacks including gold (Au) in the top thereof. Additionally, the back electrode 15 in the back surface of the substrate 1 is made of also metal stack including Au in the top thereof and extends in all regions of the SG-DFB region A, the CSG-DBR region B, the OA region C, and the SOA region D. The LD 200 provides an anti-reflecting film 16 in the facet of the SOA region D, while, a high-reflecting film 17 in the face of the OA region (C).

Figure 4B:
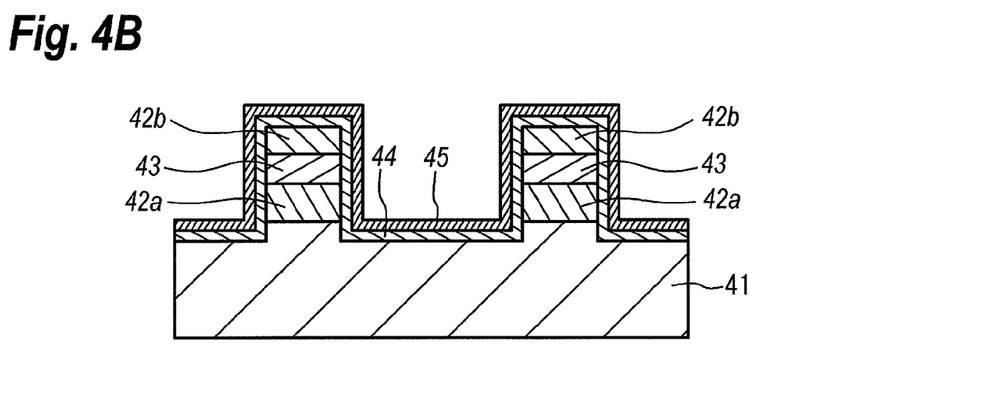
FIG. 4B shows a cross section of the interfering device taken along the line β-β appeared in FIG. 4A, and FIG. 4C also shows a cross section taken along the line γ-γ appeared in FIG. 4A.
Figure 4C:
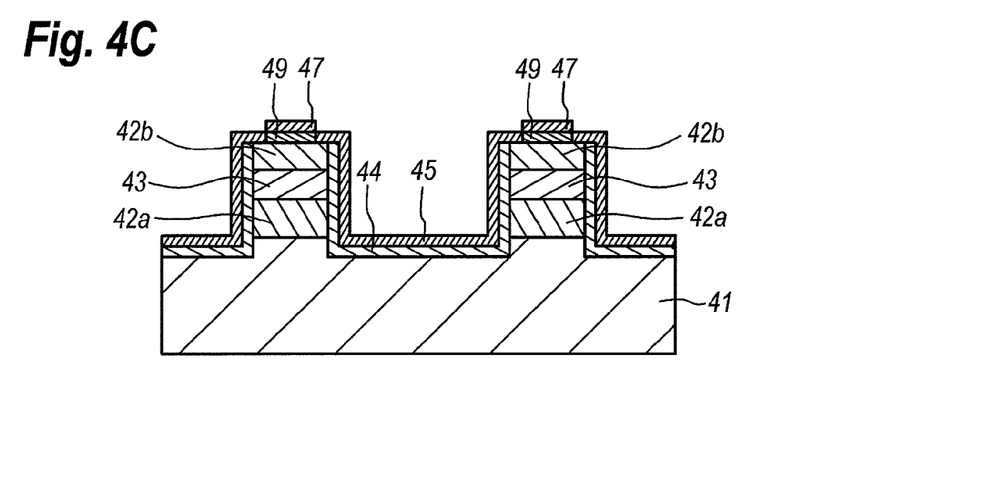

Next, the interfering device 300 will be described. FIG. 4A is a plan view of the interfering device 300, while, FIGS. 4B and 4C show cross sections each taken along the line β-β and γ-γ indicated in FIG. 4A. The interfering device 300 includes a plurality of waveguides each having a mesa structure shown in FIGS. 4B and 4C and formed on a semiconductor substrate 41.

The mesa waveguide, as shown in FIGS. 4B and 4C, includes on the semiconductor substrate 41 a lower cladding layer 42a, a core layer 43, and an upper cladding layer 42b stacked in this order on the substrate 41. An insulating film 44 and another insulating film 45 cover the surface of the semiconductor substrate 41, sides of the mesa waveguides, and the top of the mesa waveguide. The lower insulating film 44 has a function of the passivation layer to passivate the surface of the semiconductors.

The semiconductor substrate 41 is made of InP in the present embodiment. The lower cladding layer 42a and the upper cladding layer 42b are also made of InP. The core layer 43 is made of semiconductor material whose bandgap energy is smaller than that of the cladding layers, 42a or 42b. For instance, a bulk InGaAsP, an AlGaInAsP with the MQW structure, and so on, are applicable to the core layer 43. The light propagating in the core layer 43 is confined by the lower and upper cladding layers, 42a and 42b. The lower insulating film 44 is made of InP in the embodiment shown in FIGS. 4A to 4C, while, the upper insulating film 45 is made of inorganic material, typically, silicon nitride (SiN).

Referring to FIG. 4A, the interfering device 300 provides an input waveguide 32a connected to the input port 31a and an additional waveguide 32b terminated within the substrate at an end 31b thereof. Two waveguides, 32a and 32b, are coupled and branched to two arm waveguides, 34a and 34b, by the input coupler 33. The present embodiment of the interfering device 300 provides a 2×2 MMI coupler (Multi Mode Interference) for the input coupler 33. The LD 200 in the facet of the SOA region D with the anti-reflecting film 16 optically couples with the input port 31a, that is, the light emitted from the SOA region D of the LD 200 enters the interfering device 300 from the input portion 31a thereof.

One of the arm waveguides 34a couples with the other of the arm waveguides 34b and branches into two output waveguides, 36a and 36b, at another coupler 35, namely, an output coupler 35. Virtually dividing the interfering device 300 along the line extending the axis of the primary waveguide 32a, one of the output waveguides 36a, and the output port 37a terminating the waveguide 36a locate in a side of one of the arm waveguides 34b; while, the other of the output waveguides 36b and the output port 37b locate in the side including the other arm waveguide 34a. The present embodiment of the interfering device 300 provides a 2×2 MMI coupler as the output coupler 35.

Each of the arm waveguides, 34a and 34b, provides an electrode 46 for controlling a phase of light propagating therethrough, and another electrode 47 for modulating the light. The former electrode 46 for controlling the phase positions close to the input port 31a is electrically isolated from the other electrode 47 for modulating light, but the arrangement of the electrodes is not restricted to those described above.

Referring to FIG. 4C, the modulating electrode 47 positions on the upper cladding layer 42b via the contact layer 49. The contact layer 49 of the present embodiment is made of InGaAs. The insulating films, 44 and 45, are removed in a region between the upper cladding layer 42b and the contact layer 49. Specifically, the contact layer 49 comes in directly contact to a portion of the upper cladding layer 42b, and a region exposed from the contact layer 49 in the top of the mesa waveguide is covered by the upper insulating film 45. The electrode 47 covers the top of the contact layer 49 and a portion of the upper insulating film 45 around the contact layer 49. Two electrodes include a metal stack including Au as those provided in the LD 200.

Supplying a bias voltage to the electrodes, 46 and 47, the refractive index of the core layer 43 in respective arm waveguides, 34a and 34b, changes depending on the bias, which modifies the phase of the light propagating therethrough. When the interfering device 300 is used as an optical modulator, two signals complementary to each other are applied to respective electrodes 47, while, two DC biases are applied to the other electrodes 46 to adjust the phase of the light each propagating within the arm waveguides, 34a and 34b. That is, the DC bias applied to the electrodes 46 compensates the phase offset of the light.

The light entering from the input power 31a is divided by the input coupler 33 into two beams each propagating in the arm waveguide 34a and the other arm waveguide 34b, and having a magnitude comparable to each other. These two beams interfere in the output coupler 35 depending on the phase thereof and further divided into two beams each propagating in the output waveguides, 36a and 36b.

An optical length of the arm waveguide 34a and that of the other arm waveguide 34b are usually designed to be substantially equal to each other. However, depending on the fabrication process thereof and some other reasons, the phase difference between two optical beams each propagating in respective arm waveguides, 34a and 34b, occasionally scatters from 0 to ±π due to the practical difference of the optical length of respective arm waveguides, 34a and 34b, and the distribution of the light in respective output waveguides, 36a and 36b, depends on this phase difference. Thus, even when the bias conditions applied to respective arm waveguides, 34a and 34b, are equal to each other, conditions between two extrema, one of which is the light fully output from the output port 37a and the other is the light fully output from the other output port 37b, possibly appears. The optical alignment of optical devices with the interfering device 300 using only one of the output ports, 37a and 37b, is impracticable without any adjustment for the phase of the light propagating in the arm waveguides, 34a and 34b. Practically, an adjustment is carried out to even the optical output from the output port 37a and that from the other output port 37b, which is often called as the cross point tuning. However, the cross point tuning is necessary to adjust various conditions of the interfering device 300. Moreover, these conditions to be adjusted are widely scattered in device to device. The present embodiment provides a nonspecific method to align optical devices with the interfering device 300.

The energy bandgap of a semiconductor material depends on the bias applied thereto. Specifically, what is called, the Franz-Keldish effect shifts the fundamental absorption edge of a semiconductor material to a longer wavelength side, namely, to a smaller bandgap energy. Accordingly, one of the arm waveguides, 34a and 34b, is biased to shift the wavelength corresponding to the bandgap energy to a longer side, then, the optical absorption thereat increases to eliminate the interference between two optical beams at the output coupler 35. In the present embodiment, only one of the arm waveguides, 34a or 34b, transmits the light, where to the light propagating in the other of the arm waveguide is substantially fully absorbed by applying an enough bias thereto, and only one of the output waveguides, 36a or 36b, or one of the output ports, 37a or 37b, outputs the light whose magnitude correlates with the magnitude of the light entering the interfering device 300 at the input port 31a, where the magnitude of the optical output becomes about a quarter (¼) of that of the optical input. Thus, a universal optical condition independent of internal conditions of the interfering device 300 may be achieved to couple the light output therefrom with the optical fiber 500 by the preset magnitude.

Although optical losses caused by the input coupler 33, the output coupler 35, the arm waveguides, 34a and 34b, and so on affect the optical power output from the port 37a or from the other port 37b. However, such an optical loss may be small enough compared with the interfering effect, and may be ignorable.

The bias condition to realize the full absorption in the arm waveguides, 34a and 34b, depends on semiconductor materials of the interfering device 300, which equivalently means that the bias condition is substantially invariant in device to device. Thus, the cross point tuning is no longer unnecessary for the interfering device 300.

When the optical absorption in one of the arm waveguides is insufficient to bring the full absorption, the optical output from the interfering device 300 sometimes fluctuates depending on the interfering condition. The present embodiment is necessary to suppress the fluctuation in the optical output within a range allowable in the output from the optical fiber 500. In an example, when the output fluctuation observed in the output from the optical fiber 500 is necessary to be less than ±1 dB, one of the arm waveguides, 34a or 34b, is necessary to cause the absorption equal to or greater than 20 dB. On the other hand, when the arm waveguide is set in the absorption thereof about 30 dB, the output fluctuation from the optical fiber 500 may be set within ±0.3 dB.

Figure 5:
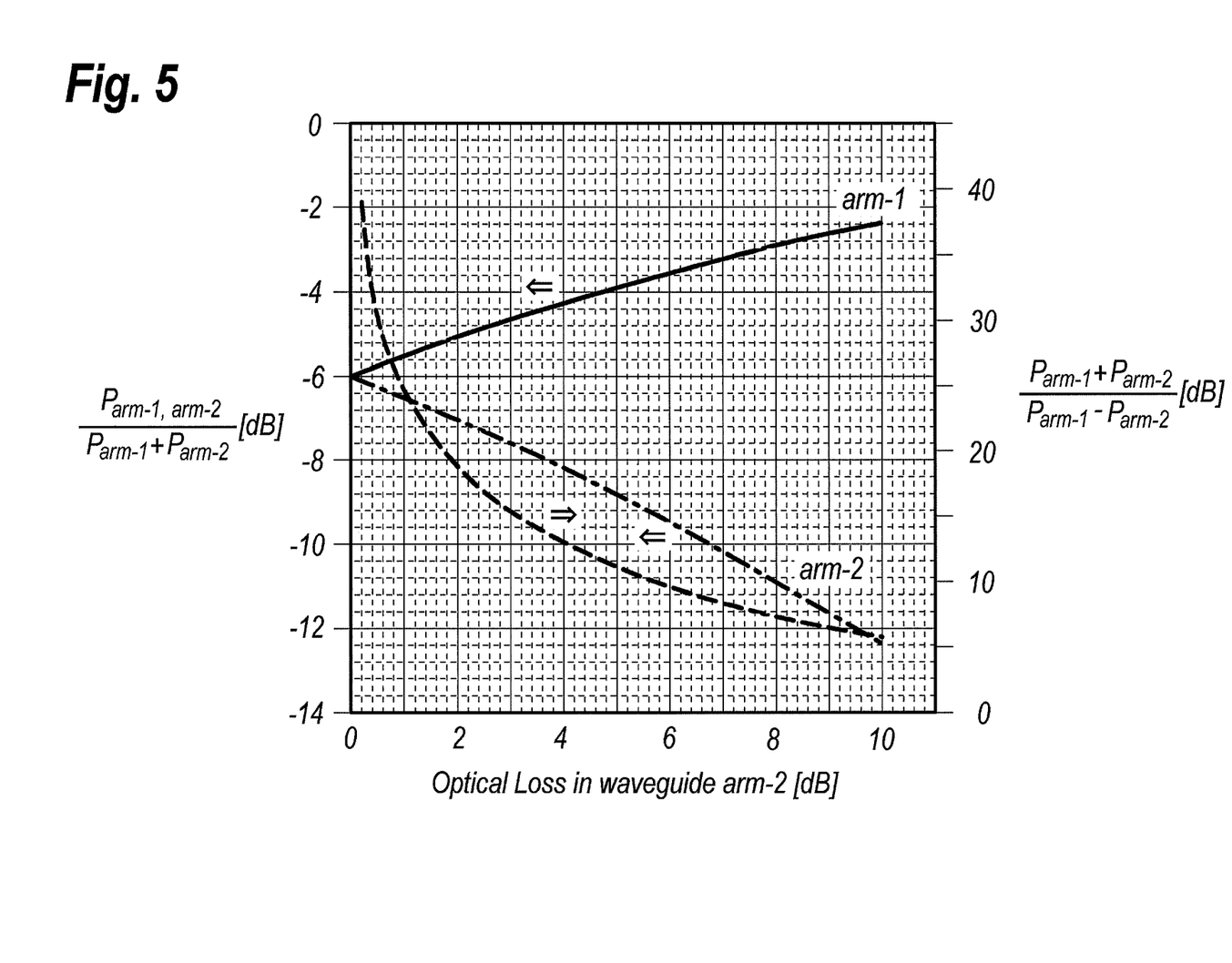
FIG. 5 shows behaviors of optical power of each of arm waveguides and a ratio when one of them causes optical loss.

FIG. 5 shows results for the optical power of respective arm waveguides, 34a and 34b, and a power ratio when one of arm waveguides, where the second arm waveguide 34b is selected, causes optical loss by some reasons. In FIG. 5, the power ratio is defined by a power when the light propagating in respective arm waveguides, 34a and 34b, is in the state of the in-phase (0°) against a power when the light in respective arm waveguides, 34a and 34b, is in the state of the out-phase (180°).

When the second arm waveguide 34b has no loss, that is, the optical power output from respective arm waveguides, 34a and 34b, are equal to each other, the power ratio becomes infinite because no light is output when the light in the second arm waveguide 34b is in the out-phase state. However, a substantial difference in the optical loss due to some reasons, such as, a loss difference in the input and output couplers, 33 and 35, those causes in respective arm waveguides, 34a and 34b, is unavoidable in a practical device. FIG. 5 summarizes such an optical loss up to 10 dB is caused in the second arm waveguide 34b. As shown in FIG. 5, when the optical loss in the arm waveguide 34b increases, the power ratio due to the phase difference between two arm waveguides, 34a and 34b, becomes small. As described, when no optical loss is caused in the second arm waveguide 34b, the power ratio is infinite, but it becomes around 5 dB when the optical loss of 10 dB is caused in the second arm waveguide 34b. Further optical loss is added in the arm waveguide 34b by reversely biasing, the power ratio may be further decreased and the power fluctuation by the phase difference between light in respective arm waveguides, 34a and 34b, becomes substantially ignorable.

Figure 6A:
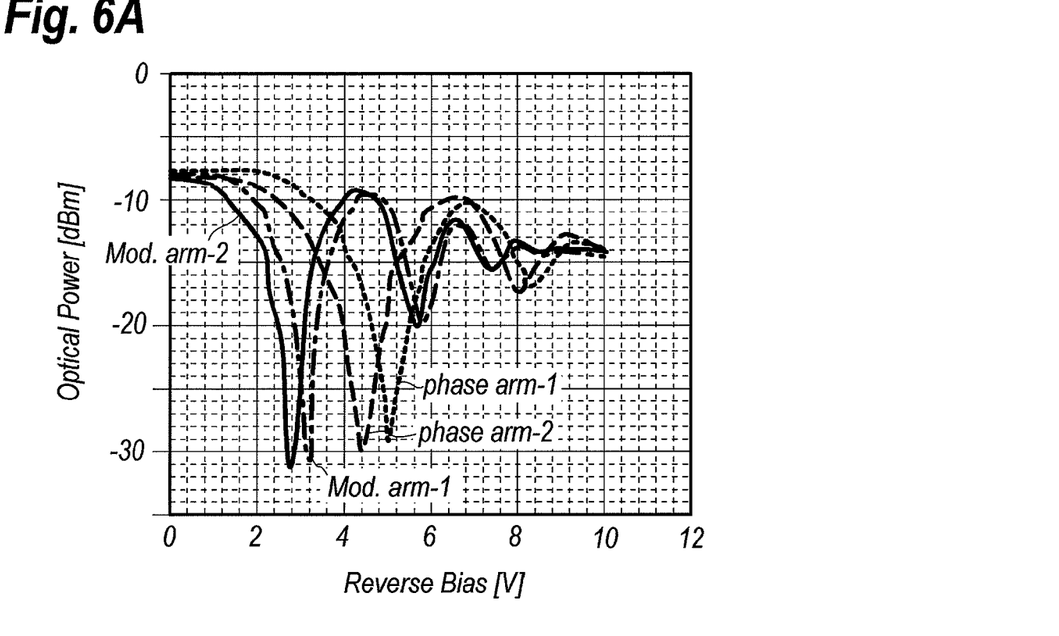
FIG. 6A shows a relation of optical power output from the interfering device against reverse bias applied to one of arm waveguides.

FIG. 6A shows the optical power output from the interfering device 300 when one of arm waveguides, 34a or 34b, is reversely biased. Because the other of arm waveguides, 34b or 34a, is left unbiased, the light output from the interfering device 300 depends on the phase difference of light propagating in respective arm waveguides, 34a and 34b. As shown in FIG. 6A, biasing one of waveguides, 34a or 34b, not only the optical power output from the device 300 decreases but the power fluctuation thereof decreases. The reverse bias of −10 V or greater decreases the output power by about 6 dB from a state of no reverse bias but stabilizes the power fluctuation thereof, which means that the arm waveguide which is reversely biased fully absorbs the light propagating therein.

Figure 6B:
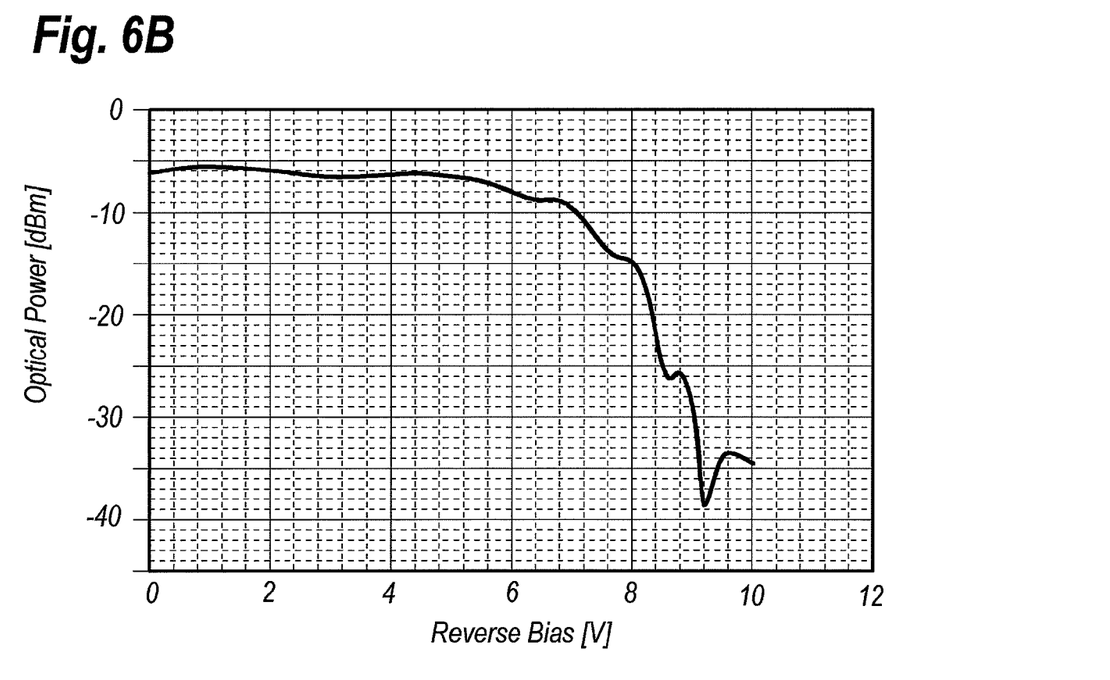
FIG. 6B shows a relation of optical power of light propagating in an arm waveguide to which the reverse bias is applied.

FIG. 6B shows the relation of the optical power against the reverse bias applied to the arm waveguide. A reverse bias about −10 V to the arm waveguide causes the absorption of the light propagating therein exceeding −30 dB (⅟1000). Thus, such a reverse bias substantially fully absorbs the light.

Next, procedures to align optical devices optically with the interfering device 300 will be described. The procedure first sets the optical module 100 on a stage prepared in an aligning apparatus, where the stage is preferable to have a function to vary a temperature of the module placed thereon. Then, the aligning apparatus supplies a reverse bias to one of the arm waveguides, 34a or 34b, of the interfering device 300 to cause the optical absorption thereat by about 20 dB or more. The reverse bias is provided via the electrode 46 for adjusting the phase, that bfor modulating light, or both.

Then, the LD 200 is practically activated by injecting current via the electrode 8 provided on the SG-DFB region A. Concurrently with the current injection, the micro heaters 10 are provided with electrical power to set temperatures of the waveguide layer 4 in preset conditions thereof. Furthermore, the temperature of the LD 200 is set in a preset condition by, for instance, a thermo-electric cooler (TEC) installed in the package 110 of the module 100. Then the LD 200 emits light with an emission wavelength determined by the gain spectrum in the SG-DFB region A and the reflection spectrum in the CSG-DBR region B.

Finally, as monitoring the optical power emitted from the end of the optical fiber 500, the Z-alignment between the J-sleeve 410 and the optical receptacle 420 is carried out such that the monitored optical power is within a preset range. The procedure of the Z-alignment sometimes includes an alignment of the coupling unit 400 with the optical module 100 in a plane perpendicular to the optical axis by sliding the flange 410a of the J-sleeve 410 on the outer surface of the side of the package 110. Thus, the optical module 100 with the coupling unit 400 is completed.

In the foregoing detailed description, the method and apparatus of the present invention have been described with reference to specific exemplary embodiments thereof. It will, however, be evident that various modifications and changes may be made thereto without departing from the broader spirit and scope of the present invention.

For instance, the procedure of the Z-alignment described above fixes the optical module 100 on the stage and the coupling unit 400 is aligned with the optical module 100. A complementary procedure, where the optical module 100 is aligned optically with the fixed coupling unit 400, is possible.

In the embodiment described above, the LD 200 and the interfering device 300 are integrated on the common semiconductor substrate 1. However, the LD 200 and the interfering device 300 may be separately formed and assembled on a carrier common to two devices, or enclosed in an independent package. Even in such an arrangement, the method of the embodiment of the invention to align optical devices optically with the interfering device 300 is applicable.

The embodiment thus described concentrates on an arrangement of the interfering device 300 having two arm waveguides. However, the method according to the invention is applicable to other arrangements of the interfering device with three or more arm waveguides. Specifically, all arm waveguides except for the selected one arm waveguide are biased to show enough optical absorption. The Z-alignment with the interfering device may be performed by the light output therefrom without performing the cross-point tuning.

The embodiment above concentrates on the mach-Zender device as the interfering device. However, the subjects of the present invention are not restricted to those devices. Any devices having the input coupler, a plurality of arm waveguides, and an output coupler are subject to the present invention. For instance, the method of the invention is applicable to the optical frequency doubler. The coupler described above has the arrangement of 2×2 MMI coupler; however, other arrangements of the coupler, such as 1×2 (2×1) MMI, or the directional coupler are applicable. Accordingly, the present specification and figures are to be regarded as illustrative rather than restrictive.

What is claimed is:

1. A method to assemble an optical module implemented with an interfering device with an optical fiber such that optical power of light output from the interfering device and entering the optical fiber is set within a preset range, the interfering device having a plurality of arm waveguides, the method comprising steps of:

selecting one of the arm waveguides formed in the interfering device, the selected one arm waveguide coupling with the optical fiber;

biasing rest of the arm waveguides not selected in the selecting step, the biased arm waveguides causing optical absorption thereat; and aligning the optical fiber with the selected arm waveguide, wherein each of the arm waveguides includes a section to control a phase of light propagating therethrough and a section to modulate the light propagating therethrough, and wherein the step of biasing rest of the arm waveguides includes a step to bias at least one of the section to control the phase of the light and the section to modulate the light.

2. The method of claim 1,
wherein the interfering device includes two arm waveguides, and
wherein the step of selecting of one of the arm waveguides includes a step of selecting one of the two arm waveguides, and the step of biasing includes a step to bias the unselected arm waveguide.

3. The method of claim 1,
wherein the interfering device includes an input coupler and an output coupler, the input coupler and the output coupler optically coupling with the plurality of arm waveguides.

4. The method of claim 3,
wherein the interfering device is an optical modulator of a Mach-Zender type.

5. The method of claim 4,
wherein the input coupler and the output coupler are a type of 2×2 multimode interference coupler having two input ports and two output ports, and the interfering device includes two arm waveguides optically coupled with the respective output ports of the input coupler and with the respective input ports of the output coupler.

6. The method of claim 3,
wherein the interfering device is made of semiconductor material formed on a semiconductor substrate.

7. The method of claim 6,
wherein the step of biasing includes a step to bias the rest of arm waveguides reversely with respect to the semiconductor substrate.

8. The method of claim 3,
wherein the step of aligning the optical device includes a step of coupling a semiconductor laser diode (LD) with the input coupler.

9. The method of claim 8,
wherein the interfering device is made of semiconductor material formed on a semiconductor substrate, and the LD is formed on the semiconductor substrate.

10. The method of claim 8,
wherein the LD is a type of a wavelength tunable LD and,
wherein the step of coupling the LD with the interfering device includes a step to tune a wavelength of light emitted from the LD.

11. The method of claim 1,
wherein the step of biasing includes a step to bias the rest of the arm waveguides so as to show optical absorption of the rest of the arm waveguides greater than 20 dB.

* * * * *